(12) United States Patent
Choi et al.

(10) Patent No.: US 8,105,942 B2
(45) Date of Patent: Jan. 31, 2012

(54) CMP-FIRST DAMASCENE PROCESS SCHEME

(75) Inventors: Jihong Choi, Fishkill, NY (US); Tibor Bolom, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 99 days.

(21) Appl. No.: 12/763,550

(22) Filed: Apr. 20, 2010

(65) Prior Publication Data
US 2011/0254139 A1    Oct. 20, 2011

(51) Int. Cl.
*H01L 21/4763* (2006.01)
(52) U.S. Cl. ......... 438/645; 438/626; 438/631; 257/752
(58) Field of Classification Search .............. 438/626, 438/631, 645; 257/752
See application file for complete search history.

(56) References Cited

U.S. PATENT DOCUMENTS

| 6,010,962 | A  | * | 1/2000 | Liu et al. ............... 438/687 |
| 6,524,950 | B1 | * | 2/2003 | Lin ....................... 438/645 |
| 7,262,127 | B2 | * | 8/2007 | Ishikawa ................ 438/622 |
| 2009/0087992 | A1 | * | 4/2009 | Srivastava et al. ...... 438/701 |
| 2010/0013104 | A1 |   | 1/2010 | Liu et al. |

* cited by examiner

*Primary Examiner* — Charles Garber
*Assistant Examiner* — Bryan Junge
(74) *Attorney, Agent, or Firm* — Ditthavong Mori & Steiner, P.C.

(57) ABSTRACT

An improved metal interconnect is formed with reduced metal voids and dendrites. An embodiment includes forming a mask layer on a dielectric layer, forming openings in the mask and dielectric layers, depositing a planarization layer over the mask layer and filling the openings, planarizing to remove the mask layer, removing the planarization layer from the openings, and filling the openings with metal. The planarization step prior to depositing the metal removes the etch undercut that occurs during formation of the openings and reduces the aspect ratio in the openings, thereby improving metal fill uniformity.

14 Claims, 5 Drawing Sheets

CMP-FIRST DAMASCENE PROCESS SCHEME

TECHNICAL FIELD

The present disclosure relates to the fabrication of metal interconnects with reduced voids and dendrites. The present disclosure is particularly applicable to 20 nanometer (nm) technology nodes and beyond.

BACKGROUND

As reductions in device scaling continue front-end-of-line (FEOL) transistor size becomes smaller and the number of transistors per unit area increases. Correspondingly, back-end-of-line (BEOL) metal interconnect line pitch decreases. In advanced chip manufacturing, the standard method of fabricating a BEOL metal interconnect layer employs a copper (Cu) damascene process. As illustrated in FIG. 1A, a dielectric layer 101 is formed over transistor 103 and substrate 105, and a dual layer hard mask 107 is formed on dielectric layer 101. Trenches 109 and vias/contact openings 111 (down to metal contact 113) are formed by lithographically patterning hard mask 107 and etching dielectric 101 through the patterned hard mask. Hard mask 107 protects the dielectric surface from etch damage. However, due to the material and etch rate differences between hard mask 107 and dielectric 101, etch undercut occurs at the dielectric interface area below the hard mask (shown at 115).

Adverting to FIG. 1B, the process continues with deposition of a barrier layer and seed layer 117 (known as a metal liner) in trenches 109 and vias/contact openings 111. Barrier/seed layer 117, however, cannot be deposited with good integrity across the undercut areas. The interface between the barrier metal and the dielectric in the vicinity of the etch undercut is degraded, thereby causing side wall voiding, or slits, and dendrite problems later in the process. In addition, as the metal trench width is reduced and the trench aspect ratio increases (for example, from 2.2 for a metal wiring pitch of 136 nm to 2.6 for a wiring pitch of 90 nm, to as high as 2.9 for a wiring pitch of 50 nm), it is becoming increasingly challenging to deposit barrier/seed layers into such high aspect ratio features with good uniformity and integrity. Furthermore, since the trench critical dimension (CD) to barrier/seed layer thickness ratio is already close to 4:1 for 22 nm node technologies, deposition of barrier/seed layer will be particularly difficult for 20 nm technology node technologies and beyond with current plasma vapor deposition (PVD) techniques.

FIG. 1C illustrates the next step, plating of Cu 119. The high aspect ratio trenches with etch undercut are also difficult to fill with metal during plating, because metals grow from the side walls and "pinch off" the trench inlet before the trench is completely filled with metal. As the inlet becomes closed, thereby preventing further flow into the trench, voids result in the metal, causing "hollow metal" defects. In addition, poor inner edge coverage becomes the source of nodules, or dendrites, in a later CMP step.

Subsequently, as illustrated in FIG. 1D, CMP is performed to remove excess metal and hard mask 107, and to planarize the surface. However, the final surface includes dishing, as shown at 121, and residue metal, or dendrites, 123, resulting from the aforementioned voids and also from the process of removing the hard mask near the undercut region.

A need therefore exists for methodology enabling the formation of metal interconnects with reduced metal void and dendrite defects.

SUMMARY

An aspect of the present disclosure is an improved method of fabricating metal interconnects with an optical planarizing layer and CMP prior to metal liner deposition.

Another aspect of the present disclosure is a semiconductor device including metal interconnects formed by depositing an optical planarizing layer and performing CMP prior to depositing the metal liner.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a metal interconnect, the method comprising: forming a mask layer on a dielectric layer; forming openings in the mask and dielectric layers; depositing a planarization layer over the mask layer and filling the openings; planarizing to remove the mask layer; removing the planarization layer from the openings; and filling the openings with metal.

Aspects of the present disclosure include forming the openings in the mask and dielectric layers, whereby an undercut portion is formed at an interface between the mask layer and the dielectric layer; and planarizing to remove the mask layer and undercut portion. Further aspects include forming trenches as the openings; forming a hard mask layer as the mask layer; depositing an optical planarization layer as the planarization layer; and chemical mechanical polishing (CMP) to remove the mask layer and undercut portion. Other aspects include depositing spin-on-carbon as the optical planarization layer. Additional aspects include forming the openings by: lithographically patterning the mask layer; and etching the dielectric layer through the patterned mask layer. Another aspect includes depositing a barrier layer and a seed layer in the trenches prior to filling with metal. Further aspects include depositing copper (Cu) or an alloy thereof to fill the trenches and form an overburden on the dielectric layer. Other aspects include CMP to remove the overburden after depositing Cu. Additional aspects include the dielectric layer comprising a porous ultra low-k dielectric, such as organosilicate glass (SiCOH); and the mask layer comprising two layers. Further aspects include the mask layer comprising a first layer of tetraethyl orthosilicate (TEOS) or octamethylcyclotetrasiloxane (OMCTS) directly on the porous ultra low-k dielectric; and a second layer of titanium nitride (TiN) on the first layer.

Another aspect of the present disclosure is a semiconductor device comprising: a dielectric layer; and metal interconnects in the dielectric layer, the metal interconnects being formed by: forming a hard mask layer on the dielectric layer; forming trenches in the hard mask and dielectric layers, whereby an undercut portion is formed at an interface between the mask layer and dielectric layer; planarizing by conducting CMP to remove the mask layer and undercut portion; and filling the trenches with metal.

Aspects include a semiconductor device wherein the hard mask layer is removed by: depositing an optical planarization layer over the hard mask layer and in the trenches; CMP the optical planarization layer down to the dielectric layer; and removing the optical planarization layer. Further aspects include the optical planarization layer comprising spin-on-carbon. Another aspect includes the metal comprising copper (Cu) or an alloy thereof. Other aspects include the dielectric layer comprises a porous ultra low-k dielectric, such as SiCOH.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
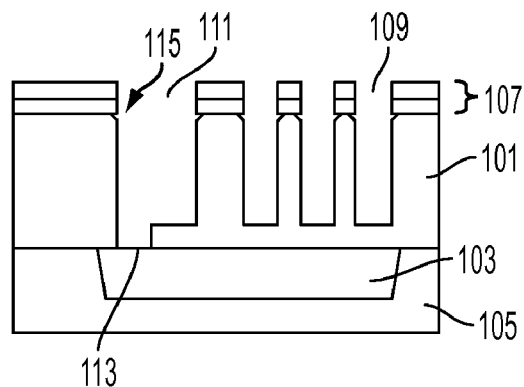
FIGS. 1A through 1D schematically illustrate sequential steps of a prior art method.
Figure 1B:
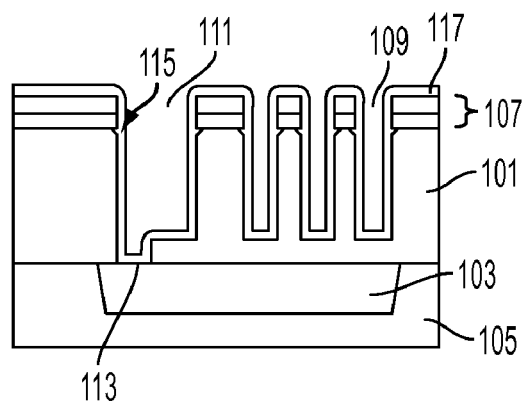
Figure 1C:
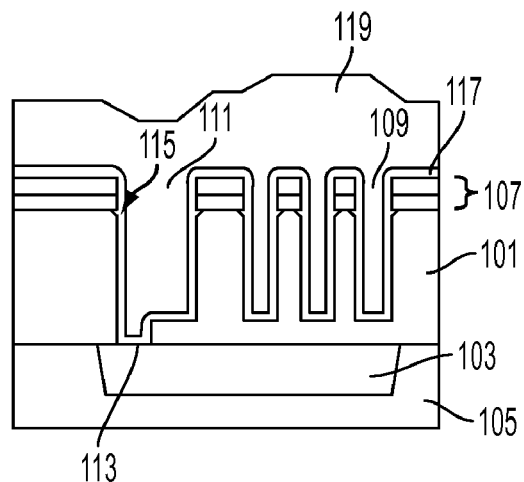
Figure 1D:
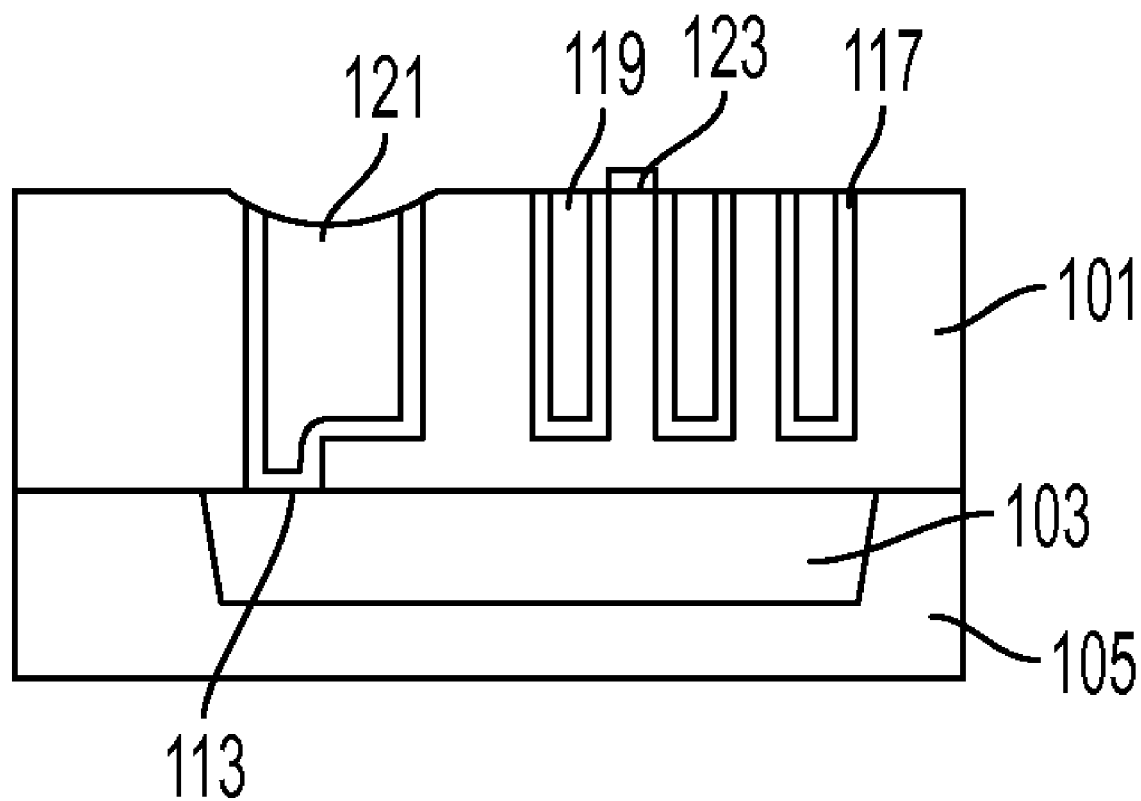

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves metal void and dendrite problem attendant upon forming metal interconnects, particularly in 20 nm or beyond technology nodes. In accordance with embodiments of the present disclosure, an optical planarization layer is deposited in vias/contact openings and trenches and then removed by CMP prior to depositing a metal liner. Consequently, etch undercut areas are eliminated prior to deposition of the metal liner. Further, since the hard mask is removed by the CMP, the aspect ratio of the trenches is reduced prior to metal plating. Therefore, metal voids and dendrites are reduced and the resulting metal interconnects are improved.

Methodology in accordance with embodiments of the present disclosure includes forming a mask layer on a dielectric layer, forming openings in the mask and dielectric layers, depositing a planarization layer over the mask layer and filling the openings, planarizing to remove the mask layer, removing the planarization layer from the openings, and filling the openings with metal.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2G illustrate sequential steps of a method in accordance with an exemplary embodiment. Adverting to FIG. 2A, the process begins in the conventional manner, by forming a dielectric layer 201 over transistor 203 and substrate 205, and forming a hard mask 207 on dielectric layer 201. Trenches 209 and vias/contact openings 211 (down to metal contact 213) are formed by lithographically patterning hard mask 207 and etching dielectric 201 through the patterned hard mask. Dielectric layer 201 may be formed, for example, of an ultra low-k material, e.g., organosilicate glass (SiCOH). Because of the high porosity of SiCOH, hard mask 207 may include two layers, a bottom layer, for example, of TEOS or OMCTS, and a top layer formed of metal, such as TiN. Hard mask 207 may alternatively be formed with no metal layer, for example, of TEOS or OMCTS and TEOS. Due to the material and etch rate differences between hard mask 207 and dielectric 201, etch undercut occurs at the dielectric interface area below the hard mask (shown at 215).

Figure 2A:
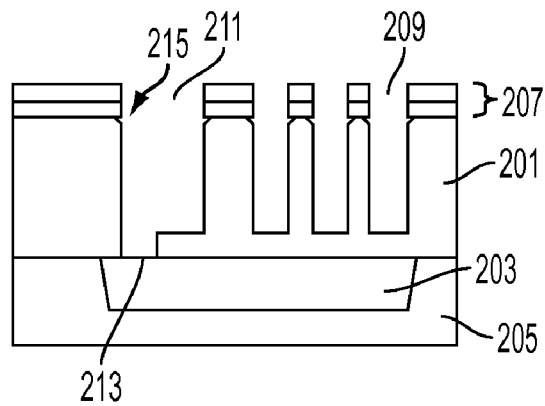
FIGS. 2A through 2G schematically illustrate sequential steps of a method in accordance with an exemplary embodiment.
Figure 2B:
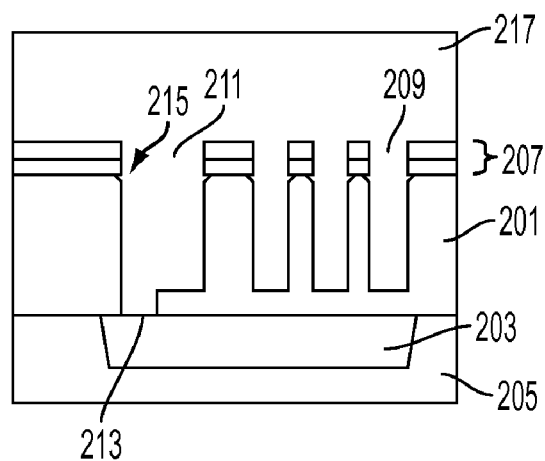

An optical planarization layer 217 is deposited in trenches 209 and vias/contact openings 211 and over hard mask 207, as illustrated in FIG. 2B. Optical planarization layer 217 may, for example, be formed of spin-on-carbon, such as HM8006 obtainable from JSR Micro.

Figure 2C:
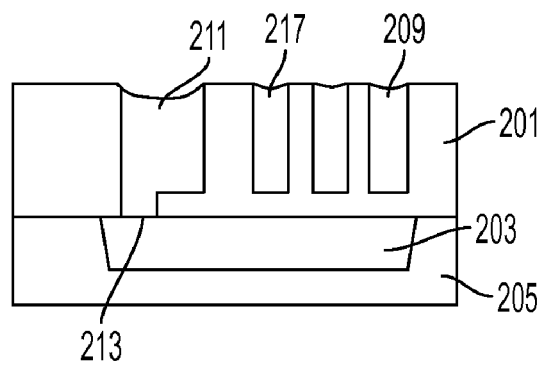
Figure 2D:
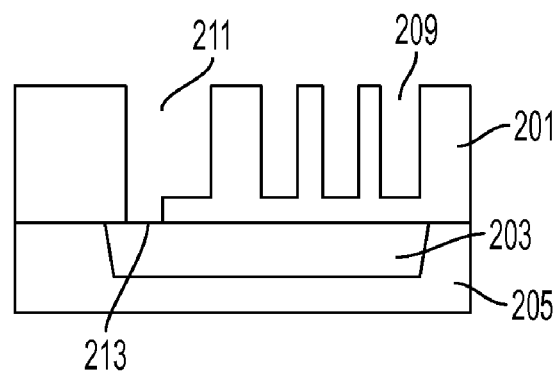

Adverting to FIG. 2C, CMP is then implemented to remove both the portions of optical planarization layer 217 that are above dielectric layer 201 and also hard mask 207. During this step, edge undercut 215 is also removed. After CMP, the remaining optical planarization layer 217 is wet etched from the trenches and vias/contact openings, resulting in FIG. 2D.

Figure 2E:
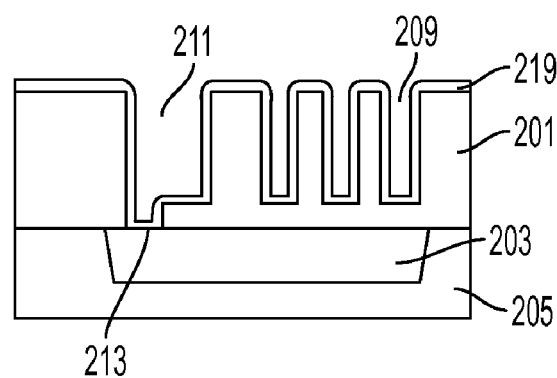

As illustrated in FIG. 2E, barrier and seed metal is deposited into trenches 209 and vias/contact openings 211 to form metal liner 219. For the deposition of liner 219, the aspect ratio of the trench is reduced, as compared with conventional techniques, due to the earlier removal of hard mask 207. For example, Table 1 shows the reduction in minimum CD trench aspect ratios for known and projected wiring pitches in accordance with the present disclosure.

TABLE 1

| Year | 2007 | 2008 | 2009 | 2010 | 2011 | 2012 | 2013 | 2014 | 2015 |
| --- | --- | --- | --- | --- | --- | --- | --- | --- | --- |
| Metal 1 wiring pitch (nm) | 136 | 118 | 104 | 90 | 80 | 72 | 64 | 56 | 50 |
| A/R after RIE (conventional way) | 2.2 | 2.4 | 2.5 | 2.6 | 2.6 | 2.6 | 2.8 | 2.8 | 2.9 |
| A/R after RIE (present disclosure) | 1.5 | 1.5 | 1.5 | 1.5 | 1.4 | 1.4 | 1.4 | 1.4 | 1.3 |

As a result of the reduced aspect ratio and the early elimination of the etch undercut regions 215, the barrier and seed metal can be deposited with better uniformity and integrity.

Figure 2F:
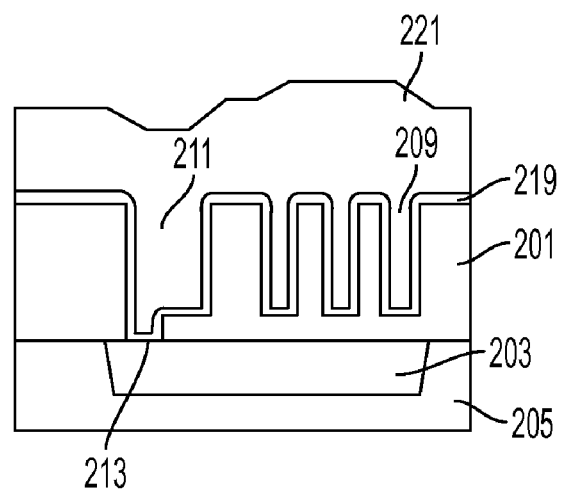
Figure 2G:
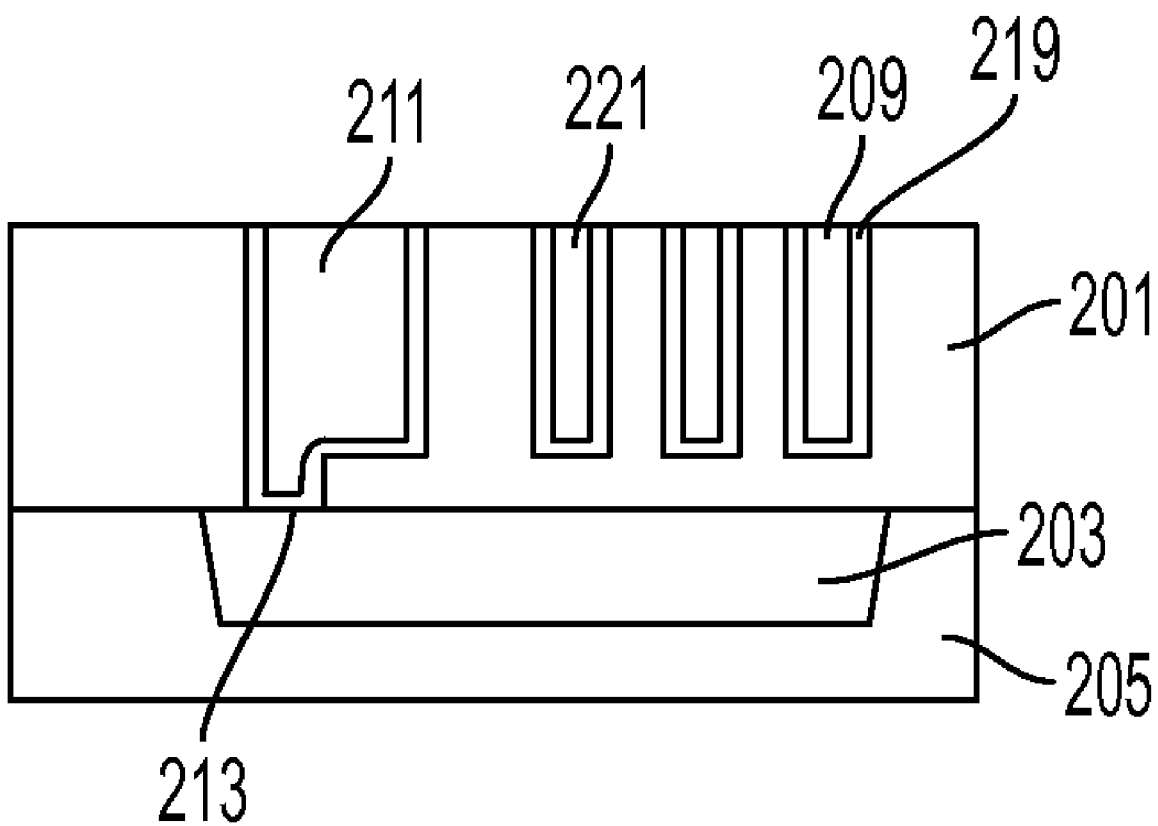

Adverting to FIG. 2F, Cu or an alloy thereof is deposited, for example by applying Cu plating, to fill trenches 209 and vias/contact openings 211 and form an overburden on the dielectric layer. The reduction in aspect ratio significantly improves Cu filling of trenches 209 with no pinching off at the top of the trenches. A final CMP to remove the overburden completes the process, as illustrated in FIG. 2G. Since hard mask 207 was removed earlier in the process, the CMP process window can be greater than in conventional practices, thereby improving flexibility.

Embodiments of the present disclosure achieve several technical effects, including reduced metal voids and dendrite defects, resulting in improved metal interconnects. The present disclosure enjoys industrial applicability in any of various types of highly integrated semiconductor devices particularly 20 nm node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating a metal interconnect, the method comprising:
   forming a mask layer on a dielectric layer;
   forming openings in the mask and dielectric layers;
   depositing a planarization layer over the mask layer and filling the openings;
   planarizing to remove the mask layer;
   removing the planarization layer from the openings; and
   filling the openings with metal.

2. The method according to claim 1, comprising:
   forming the openings in the mask and dielectric layers, whereby an undercut portion is formed at an interface between the mask layer and the dielectric layer; and
   planarizing to remove the mask layer and undercut portion.

3. The method according to claim 2, comprising:
   forming trenches as the openings;
   forming a hard mask layer as the mask layer;
   depositing an optical planarization layer as the planarization layer; and
   chemical mechanical polishing (CMP) to remove the mask layer and undercut portion.

4. The method according to claim 3, comprising depositing spin-on-carbon as the optical planarization layer.

5. The method according to claim 1, comprising forming the openings by:
   lithographically patterning the mask layer; and
   etching the dielectric layer through the patterned mask layer.

6. The method according to claim 3, comprising depositing a barrier layer and a seed layer in the trenches prior to filling with metal.

7. The method according to claim 6, comprising depositing copper (Cu) or an alloy thereof to fill the trenches and form an overburden on the dielectric layer.

8. The method according to claim 7, comprising CMP to remove the overburden after depositing Cu.

9. The method according to claim 8, wherein:
   the dielectric layer comprises a porous ultra low-k dielectric; and
   the mask layer comprises two layers.

10. The method according to claim 9, wherein the dielectric layer comprises organosilicate glass (SiCOH).

11. The method according to claim 10, wherein:
    the mask layer comprises a first layer of tetraethyl orthosilicate (TEOS) or octamethylcyclotetrasiloxane (OMCTS) directly on the porous ultra low-k dielectric; and
    a second layer of titanium nitride (TiN) on the first layer.

12. A method of fabricating a semiconductor device, the method comprising:
    depositing a dielectric layer over a substrate;
    forming a hard mask layer on the dielectric layer;
    lithographically patterning the hard mask layer;
    etching the dielectric layer through the patterned hard mask to form trenches and via/contact openings, whereby an undercut portion is formed at an interface between the mask layer and dielectric layer;
    depositing an optical planarization layer over the hard mask layer filling the trenches and via/contact openings;
    planarizing by conducting chemical mechanical polishing (CMP) to remove the mask layer and undercut portion;
    wet etching to remove the optical planarization layer;
    depositing barrier and seed metal in the trenches and via/contact openings;
    copper (Cu) plating to fill the trenches and via/contact openings and forming an overburden on the dielectric layer; and
    conducting CMP to remove the overburden.

13. The method according to claim 12, wherein the optical planarization layer comprises spin-on-carbon.

14. The method according to claim 13, wherein:
    the dielectric layer comprises a porous ultra low-k dielectric; and
    the hard mask layer comprises:
       a first layer of TEOS or OMCTS directly on the porous ultra low-k dielectric; and
       a second layer of TiN on the first layer.

* * * * *